(12) United States Patent
Natekar et al.

(10) Patent No.: US 7,514,116 B2
(45) Date of Patent: Apr. 7, 2009

(54) HORIZONTAL CARBON NANOTUBES BY VERTICAL GROWTH AND ROLLING

(75) Inventors: Devendra Natekar, Chandler, AZ (US); Yoshihiro Tomita, Tsukuba (JP); Chi-Won Hwang, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 423 days.

(21) Appl. No.: 11/322,504

(22) Filed: Dec. 30, 2005

(65) Prior Publication Data

US 2007/0152194 A1    Jul. 5, 2007

(51) Int. Cl.
*C23C 16/00* (2006.01)
(52) U.S. Cl. ...................................... 427/96.1; 427/355
(58) Field of Classification Search ................. 427/96.1, 427/402, 355, 359, 365; 423/445 R, 460
See application file for complete search history.

(56) References Cited

U.S. PATENT DOCUMENTS

| 2002/0014667 A1* | 2/2002 | Shin et al. .................... 257/368 |
| 2002/0179564 A1* | 12/2002 | Geobegan et al. .............. 216/7 |
| 2007/0099336 A1* | 5/2007 | Weston et al. ................. 438/99 |

OTHER PUBLICATIONS

Hideo Ishibashi, "Paste containing metal nanoparticles at high concentration", Chemistry and Chemical industry No. 9, vol. 57 (2004), pp. 945-947.*

* cited by examiner

*Primary Examiner*—Timothy H Meeks
*Assistant Examiner*—Nathan Leong
(74) *Attorney, Agent, or Firm*—Blakely, Sokoloff, Taylor & Zafman LLP

(57) ABSTRACT

Horizontal carbon nanotubes may be used for on-die routing and other applications. In one example, a catalyst is applied to a plurality of different points on a substrate. Carbon nanotubes are then grown vertically on the plurality of different points to form a plurality of vertical carbon nanotube structures on the substrate. The vertical carbon nanotube structures are then rolled to form horizontal carbon nanotube structures.

14 Claims, 5 Drawing Sheets

US 7,514,116 B2

HORIZONTAL CARBON NANOTUBES BY VERTICAL GROWTH AND ROLLING

FIELD

The present description relates to applying conductive patterns to microelectronic devices and, in particular to applying nano-particle pastes and carbon nanotubes.

BACKGROUND

In microelectronic devices, different dies containing complex electronic circuits are stacked on top of each other to form the complete device. The circuits on different dies are connected together electrically using vias, interconnects, pads, balls, pins, and other kinds of metallic structures. Vias and interconnects are also used to carry power, data, and control signals into and out of the stack. The interconnection devices on each die are lined up in the design of each die layer to make the appropriate connections. Since the dies in each layer must use the same pattern of vias, interconnects, or pads, any differences between the dies in how the connections are used must occur inside the die. The routing between vias and interconnects and circuits in the die is called a redistribution layer (RDL).

On-die redistribution requires that the RDL be formed using silicon processing vacuum chamber type equipment. This equipment uses a combination of masks with sputtering and plating techniques. Any change in the pattern requires different masks and the sputtering and plating formulas, temperatures and times must be adjusted to accommodate the new pattern. This makes the RDL very expensive to form inside the die and very expensive to change. It is accordingly difficult to adapt the die to different applications such as adapting the die to work with other components in a different stack.

Flexibility may be desired, for example when interfacing a die stack with an external silicon device that couples to the die stack using WB (wire bond) pads. The WB pads may be wired externally at some complexity and expense. However a TSV (Through Silicon Via) type architecture might require a flip-chip connection to the external device. An RDL (Redistribution Layer) may again be needed to make the connections between the external and internal silicon interconnections. When the external device is changed or modified, the masks and processes for the RDL must again be changed.

Electro-plating and etching techniques have been used for wiring in silicon substrates and PCB (printed circuit board). However, the processes are complex and expensive. Wet plating processes have also been used but these can induce a substrate to absorb moisture, requiring a drying step for the resulting module in the packaging or assembly process.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

Nano-particle paste may be applied to microelectronic devices to create electrical connections. The paste may be applied using ink jet and other printing technologies avoiding the expense of common silicon processing operation. Printed or applied nano-particle paste may be used for flexible on-die routing, for example for laying down an external RDL (redistribution layer). The paste may be used to reroute interconnections for external layers of silicon in a TSV-enabled die stack. This allows more flexible RDL manufacturing for WB (wire bond) dies. It also allows the interconnection pitch for tight pitch TSV to be increased. In addition, the rerouting allows flexibility in laying out daisy chains for TSV enabled TV (Test Vehicles).

After silicon processing, a nano-particle paste may be applied external to the silicon processing layers or in-between layers without photolithography, chemical vapor deposition, etching and other similar processes. The paste layer is completely flexible in the paths that may be applied and multiple patterns may be used. Paste application processes may be performed at high volume and allow additional silicon layers to be stacked on top of the applied nano-particle paste. This supports TSV architectures. Nano-particle pastes also show high TPT (Through Put Time) and flexibility. In addition, they can sustain HVM (High Volume Manufacturing).

Carbon nanotubes (CNTs) may be used in nano-particle pastes to reinforce printed and applied paste-based metal wires. Such printed wires may be used in a wide range of electric circuits or metallic interconnections and the CNTs provide superior electrical and thermal conductivities, higher current densities, and remarkably improved strength compared to metal wires printed without CNT reinforcement.

Ink jet printed wires using nano metal paste with CNT reinforcement may be used directly as conductive wires in electronic and semiconductor devices. Such printed wires are not only very strong but also flexible and this increases the resistance against crack generation and propagation.

Figure 1:
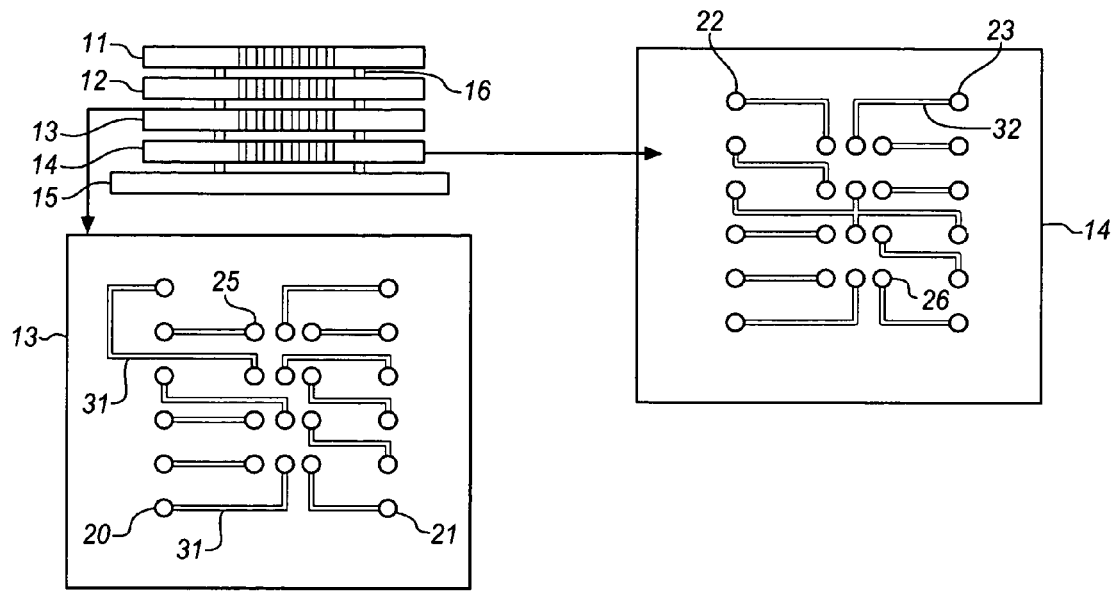
FIG. 1 is a diagram of a TSV-architecture die stack in a side elevation view, showing top elevation views of two of the dies in the stack so that vias and interconnects may be shown with printed wires according to an embodiment of the invention.

FIG. 1 shows an example of a TSV enabled architecture package. In FIG. 1, a set of four dies 11, 12, 13, 14 are stacked on a substrate 15. The substrate supplies power, ground, control and data connections. The particular connections are common in many TSV architecturs, however, more or fewer types of connection may be used depending on the application. Through hole vias 16 extend through each of the dies to interconnect the circuits on each die. The vias are typically formed by drilling or etching a hole in each die and then filling the hole with a conductor such as copper, although other types of vias may also be used. The dies are shown as being spaced apart vertically with a gap between each die, however, this is for illustration purposes only. The dies are typically sandwiched together directly or with an insulating layer in between and then sealed into a package (not shown) for protection. While four dies are shown, more or fewer dies may be used depending on the application.

As shown in FIG. 1, the two lower dies 13, 14 have the same via and interconnect layout. The other two dies may also have the same via and interconnect layout. On the side of each die is a column of interconnects 20, 21, 22, 23. Corresponding interconnects on each die are coupled to each other across all of the dies. A group of vias 25, 26 are clustered in the central area of each die. The vias are aligned on each die so that they may be interconnected across the dies. The vias are tight pitch to save die space for design layout. Accordingly, an RDL is used to increase the interconnection pitch to make interconnection feasible.

Nano-particle paste may be used to form a RDL 31, 32. The RDL allows the interconnection pitch to be increased. In FIG. 1 while the via and the interconnection layout is identical, the RDL creates different connections. The RDL is shown as circuit lines 31, 32 printed on the surface of the layer. As shown in FIG. 1, the circuit lines are different between the two dies 13, 14. This allows the assignment of the vias and the signal, ground, and power signals to be different for each die. With a conventional RDL, changing the assignments for the vias and the interconnections would require routing within the die. The routing would be generated using separate masks and silicon processing for each die. By creating the routing using printed nano-particle paste costs are reduced and the routing may easily be adapted to each die by printing a different pattern.

Figure 2:
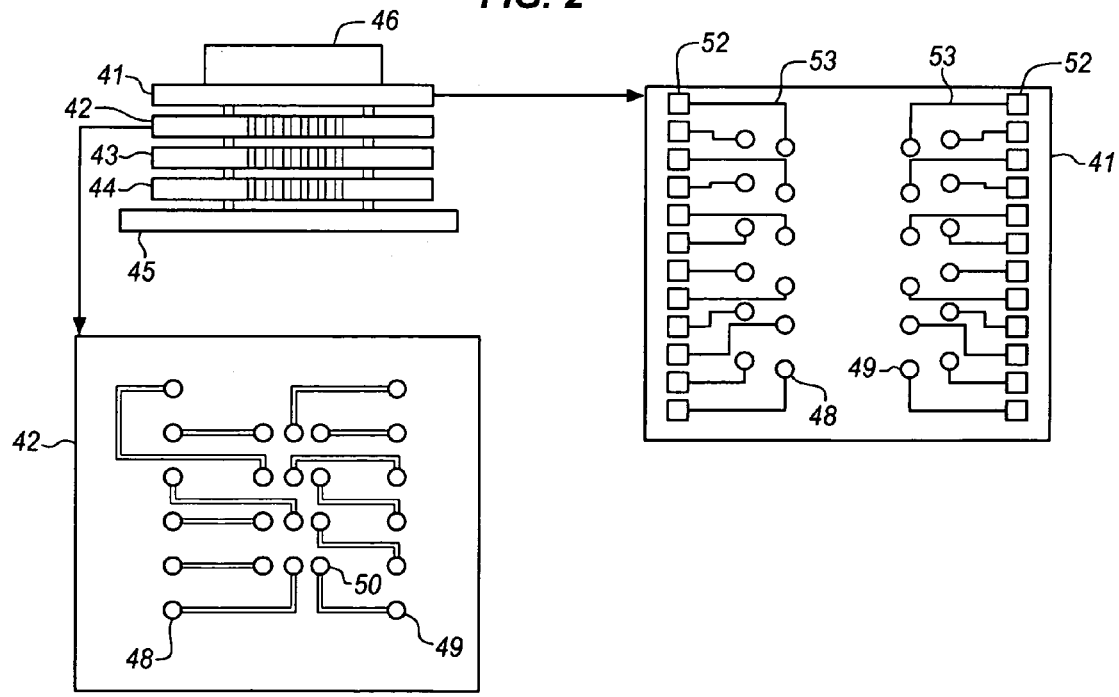
FIG. 2 is a diagram of another TSV-architecture die stack in a side elevation view, showing top elevation views of two of the dies in the stack so that vias and interconnects may be shown with printed wires according to an embodiment of the invention.

FIG. 2 shows another example of a TSV-enabled architecture package. In FIG. 2, another set of four dies, 41, 42, 43, 44 are stacked together and mounted to a substrate 45. An additional top die 46 in the stack is external silicon. While the first four dies are coupled using vias 50 and interconnects 48, 49, the external silicon is coupled to the other layers using WB pads 52, in the form of plated solder bumps, for example, however other forms may also be used. FIG. 2 shows two columns of WB pads on the top die 41. These will couple directly and physically to corresponding pads (not shown) on the external silicon. The top die may also use a nano-particle paste to form circuit lines 53 as shown in FIG. 2 that connect the interconnects of the die to the WB pads. RDL on the surface of the die allows any of the interconnects to the be coupled to any of the WB pads. The connections may be easily modified for another die by changing the printed nano-particle paste pattern. The cost and flexibility is much better than with creating an extra metal layer using silicon processing fabrication technology. The pattern may also be changed more easily than changing a mask for silicon processing.

Figure 3A:
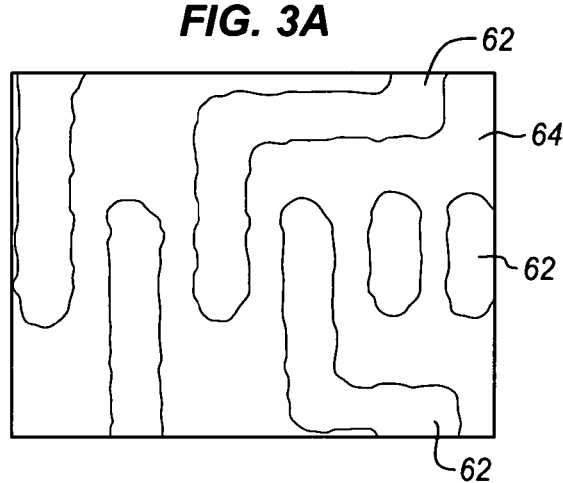
FIG. 3A is a drawing of a top view of a printed circuit such as those of FIGS. 1 and 2 based on a scanning electron microscope photograph according to an embodiment of the invention.
Figure 3B:
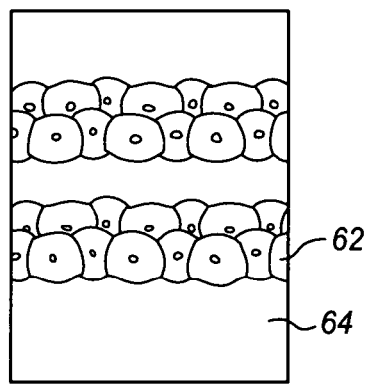
FIG. 3B is a drawing of a close-up top view of the printed circuit of FIG. 3A based on a scanning electron microscope photograph according to an embodiment of the invention.
Figure 3C:
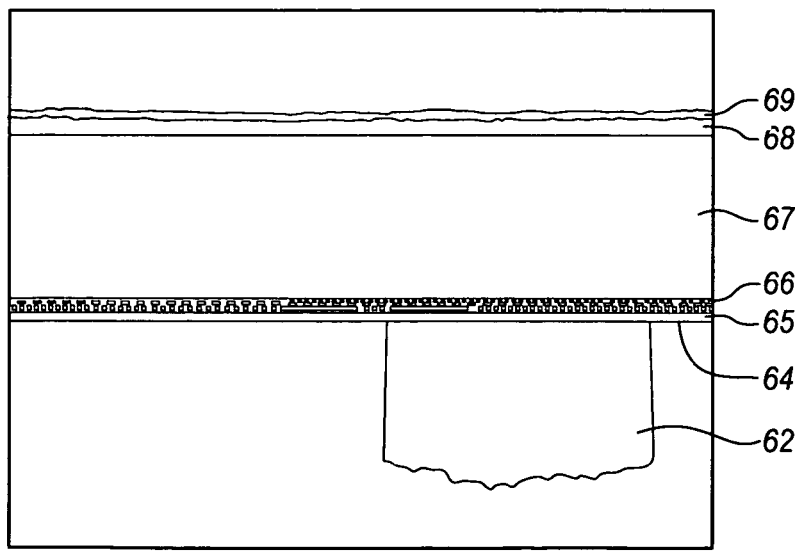
FIG. 3C is a drawing of a close-up side cross-sectional of the printed circuit of FIG. 3A based on a scanning electron microscope photograph according to an embodiment of the invention.

FIGS. 3A, 3B, and 3C show an example of using nano-particle paste based RDL in more detail. FIGS. 3A, 3B, and 3C are drawings based on scanning electron microscope (SEM) pictures of a simple circuit 62 applied by an ink jet printing process using Cu-nano-paste ink on the back of a die 64. The ink jet printing process lays down a series of dots which then merge to form a line. The dots are more easily seen in FIG. 3B which is based on a more highly magnified picture. The dotted structure shown in FIG. 3B is an example of results obtained with a particular process. Using other nano-paste inks or printers, the resulting line may be smoother, especially after curing and distinct dots may not be visible or may be much less distinct.

Curing may be used to solidify the paste. Lines and spacing on the order of 10/10 microns can be achieved. Line thicknesses of the order of 1-5 microns are possible. Thicker lines may be formed but line spacing may be reduced as the paste, having a higher height spreads out laterally during curing or over time. An alternative to achieving thicker lines without increasing line and spacing is by laying down a first line, partially curing it and laying down another line on top of the first line and then curing the stack completely. The thinner lines will not spread as much and stop spreading after they are cured. The process of laying down lines on top of each other may be repeated to achieve many desired final line thicknesses.

FIG. 3C is based on a more highly magnified picture and shows the circuit line 62 in a cross-sectional view, applied to the bottom surface 64 of the die. In the example of FIG. 3C, the die has an interlayer dielectric layer (ILD) 66 and an outer buffer layer 67. The circuit line is applied over the buffer layer. The top side of the die is also covered with a dielectric layer 68 and a metal layer 69. While FIG. 3C shows copper lines on the bottom side of the die, layers may also or alternatively be applied to the other side of the die. While FIGS. 1 and 2 both show TSV architecture die stacks, printed wires, such as those shown in FIG. 3 may be applied to a wide range of different architectures, including architectures that do not use a stack but still have connection points that are to be interconnected. The printed wires may be applied between layers within a die or to an external surface of the die. The printed wires may also be applied to a package that encloses the die or to some other external surface. Printed wires may also be used on printed circuit boards and sockets to which such dies or packages are attached.

The non-particle paste may be formed from a variety of different materials. Pastes containing copper, such as Cu-nano paste, work well with other copper electrical connections as are common in many microelectronic devices. However, other conductive material may be used, including Ag, Au, Ni, Fe, In, Sn, and carbon materials, among others. The Cu-nano paste may include a dispersant, a stabilizer, a solvent and additives in addition to the copper. The specific formulation of the paste may be adapted to suit the particle printer and the conditions under which the paste is to be printed.

Some ink-jet printed wires suffer from brittleness and lower conductivity compared to bulk, vapor deposited and electroplated counterparts. Such wires may also be prone to cracking. The brittleness and poor conductivity may be caused by internal stresses in the ink jet printed wire during sintering when the nano-paste and bulk metal change volume at different rates. The brittleness and poor conductivity may also be caused by the high concentration of impurities common in ink jet printed materials, such as dispersant, fluxing agent, stabilizer, etc. The brittleness and poor conductivity may also be caused by degassing from inside the printed wire during sintering and incomplete necking between the nano particles. The porous microstructures of printed nano-paste may also cause cracking by providing potential crack initiation points, especially at an edge point or a free surface of the wire. After sintering, a typical printed nano-paste wire may have many voids in the surface that form as holes to allow degassing.

One way to enhance the properties of printed wires is to use carbon nanotubes (CNTs). Single-walled carbon nanotubes (SWCNTs) and multi-walled carbon nanotubes (MWCNTs) have a particularly desirable combination of electrical, thermal, and mechanical properties. In many applications, they have an elastic stiffness comparable to that of diamond. Also, depending on bonding orientation, CNTs may conduct electricity along their length with very little resistance and provide high thermal conductivity. This may be attractive for heat transport management in semiconductor and electronic devices.

In many CNT designs, a nearly one-dimensional electronic structure, causes electronic transport in metallic CNTs to occur ballistically (e.g., without scattering) over long nanotubes lengths. This allows the CNTs to carry high currents with essentially no heating. SWCNT have been shown to exhibit a longitudinal conductivity of around $10^8$ (/Ωcm) at 300° K which is higher than that of Cu ($5.96 \times 10^5$/Ωcm) by about 1000 times. MWCNTs have also been shown to carry a very high current density ranging from about $10^6$ (A/cm$^2$) to $10^{10}$. CNTs have also been shown to exhibit very high longitudinal thermal conductivity. A measured room temperature thermal conductivity for an individual MWCNT (>3000 W/mK) is greater than that of natural diamond and basal plane of graphite (both of 2000 W/mK). CNTs are quite stiff and exceptionally strong, meaning that they have a high Young's modulus and high tensile strength. The Young's modules of CNTs may range from about 1000 GPa to 1500 GPa. This is more than double that of silicon carbide (450 GPa).

A nano-particle paste may be produced using either single walled carbon nanotubes (SWCNTs), or multi walled carbon nanotube (MWCNTs), or both. The paste may be used for any of the circuit line printing applications mentioned above as well as for other purposes. Some ink jet printing applications may include conductive wires, electrode pads, and surface protect layers.

In such a paste, the CNTs grown on any substrate may have a density ranging from about 1% to 99% in volume. Any metal particles capable of being rendered in nanometer sized particles may be used in the paste. Such materials may include pure copper (Cu), silver (Ag) and gold (Au), and iron (Fe), for example, although other materials with good electrical or thermal conductivity may also be used, including Ni, In, Bi, Sn and many alloys of these materials.

CNT structures may be applied to a variety of different substrates in a variety of different ways. In one embodiment, CNT may be grown vertically as shown in FIGS. 4A and 4B.

CNTs may be produced on metal bumps by various synthesis methods, including chemical vapor deposition (CVD), laser ablation, and arc discharge. In low temperature CVD techniques, the carbon source may be a carbon bearing gas, e.g. $C_2H_2/H_2$ mixture gas at a 1:3 ratio. The growth may be catalyzed by a metallic catalyst, such as Fe or Ni. Co, Pd, and Pt may also be used instead or in addition to Fe or Ni. The particular choice of catalysts may be adapted to the particular circumstances. Such a CVD synthesis technique presents several significant advantages.

First, the CNTs grow only where the catalyst is present on the surface. Accordingly, by producing a well-defined pattern of the catalyst by, for example photolithography, e-beam lithography, shadow masking, soft lithography, or printing, a corresponding well-defined pattern of CNT structures may be grown. In addition, the density of the CNT structures may be adjusted by adjusting the amount of catalyst delivered on the substrate. The diameter of the CNT structures may also be controlled by controlling the size of the catalyst. Finally, the length of the CNT structures may be controlled by controlling the synthesis conditions, such as the reaction time and temperature and the composition of the carbon bearing source and the gas pressure in the CVD reaction chamber.

Figure 4A:
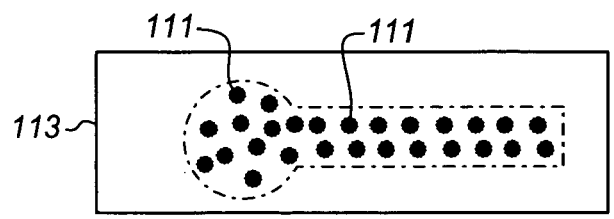
FIG. 4A is a diagram of a top view of vertical features with carbon nanotubes grown on a substrate according to an embodiment of the invention.
Figure 4B:
FIG. 4B is a diagram of a side view of the vertical features of FIG. 4A.

In FIGS. 4A and 4B, a pattern of vertical CNT structures 111 is shown on a substrate 113. FIG. 4A shows a top elevation view while FIG. 4B shows a cross-sectional side view of the same structures. These structures may be grown as described above by applying a catalyst, such as Ni, in a pattern, and then using CVD to grow the CNTs in a reaction chamber.

Figure 5A:
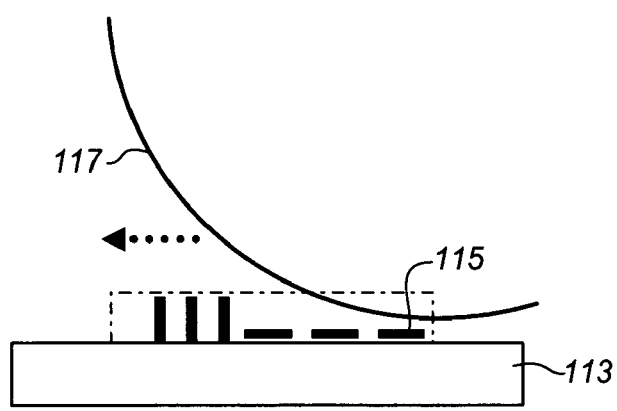
FIG. 5A is a diagram of rolling the vertical features of FIG. 4A to render horizontal features according to an embodiment of the invention.
Figure 5B:
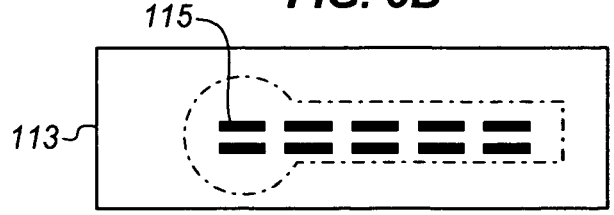
FIG. 5B is a diagram of a top view of horizontal features formed as shown in FIG. 5A according to an embodiment of the invention.
Figure 5C:
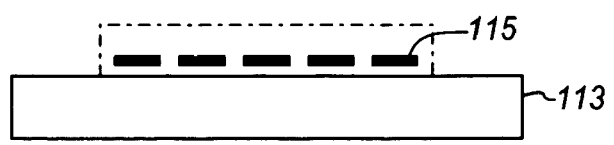
FIG. 5C is a diagram of a side view of the horizontal features of FIG. 5B according to an embodiment of the invention.

In FIG. 5A the same structures 111 and substrate are shown. However, a roller 117 is applied to the structures to produce horizontally aligned CNT structures 115 on the substrate 113. A variety of different rolling techniques may be used. FIG. 5B shows a top elevation view of the horizontal structures 117 on the substrate after rolling and FIG. 5C shows a cross-sectional side view of the same horizontal structures.

Figure 6A:
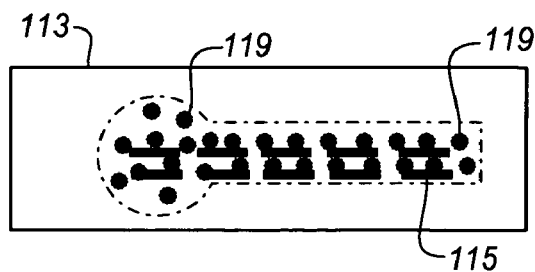
FIG. 6A is a diagram of a top view of horizontal and vertical features with carbon nanotubes grown on a substrate according to an embodiment of the invention.
Figure 6B:
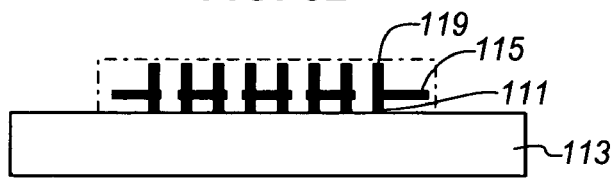
FIG. 6B is a diagram of a side view of the horizontal and vertical features of FIG. 6A.

The vertically aligned CNTs in of FIG. 4A show good electrical and thermal conductivities along the vertical direction and a strong resistance against horizontal cracks. The horizontally aligned CNTs show good electrical and thermal conductivities along the horizontal direction and a strong resistance against vertical cracks. As shown in FIGS. 6A and 6B, vertical and horizontal structures may be combined. These structures tend to show good electrical and thermal conductivities along the horizontal and the vertical directions together with strong resistance against vertical and horizontal cracks. These different options allow the alignment direction of CNTs to be chosen according to the particular application and cost targets.

Vertically and horizontally mixed CNTs may be produced on a substrate by growing vertical CNTs on top of horizontal CNTs. This is shown in FIG. 6A in which both horizontal 115 and vertical 119 CNT structures may be seen on the substrate 113. As seen in FIG. 6B, the original vertical structures 111, have been rolled to create horizontal structures 115 and then additional vertical structures 119 may be grown on top of the horizontal structures.

Figure 7A:
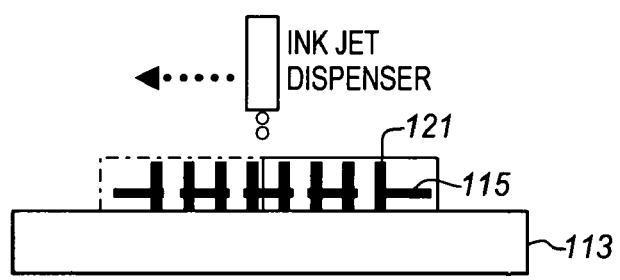
FIG. 7A is a diagram of ink jet printing vertical features on the horizontal features of FIG. 5C to render vertical and horizontal features according to an embodiment of the invention.
Figure 7B:
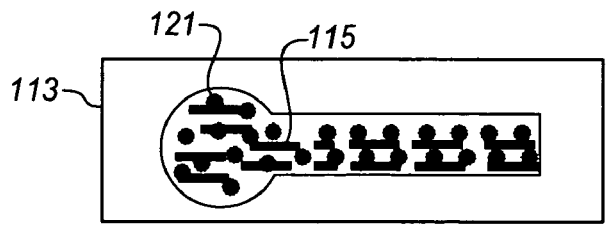
FIG. 7B is a diagram of a top view of horizontal and vertical features formed as shown in FIG. 7A according to an embodiment of the invention.
Figure 7C:
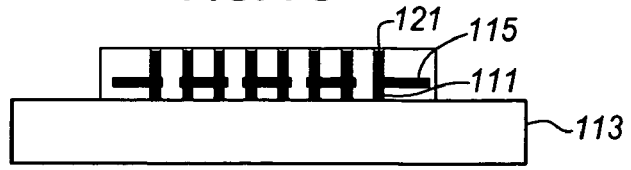
FIG. 7C is a diagram of a side view of the horizontal features and vertical features of FIG. 5B according to an embodiment of the invention.

In FIG. 7A, the vertical structures 121 are formed by ink jet printing nano paste over aligned CNTs. Ink jet printing techniques using nano paste may be used for applying wiring patterns over the vertically and horizontally aligned CNTs on a substrate. Ink jet printing may also be used to print the CNT filled nano paste directly on a substrate without any catalyst using, for example, any of the approaches mentioned above. Any vertical or horizontal pattern may be produced using ink jet printing. FIG. 7B shows a top view of the resulting structure and FIG. 7C shows a cross-sectional side view of the resulting CNT ink jet structure.

After ink jet printing, a sintering process may be used to cure the printed patterns. Sintering helps to coalesce the nanometer sized metal particles to bulk metal and may be performed at significantly lower temperatures than sintering a corresponding bulk metal structure. For some applications sintering may be performed at about 200° C. for Ag, Au, or Cu nano-pastes.

A nano-particle paste with carbon nanotubes may be ink-jet printed. Commercial black powder carbon nanotubes may be mixed with metal nano-particle paste for ink jet printing. Alternatively, the carbon nanotubes may be deposited or grown using CVD as mentioned above. When the nanotubes are formed directly on the substrate, they tend to be better aligned. The wiring lines shown and described may be made with carbon nanotubes in either CVD or ink jet printing processes. In addition, printing and CVD techniques may be combined as shown, for example in FIG. 6, in which the nano paste is printed over the CVD carbon nanotubes.

Figure 8:
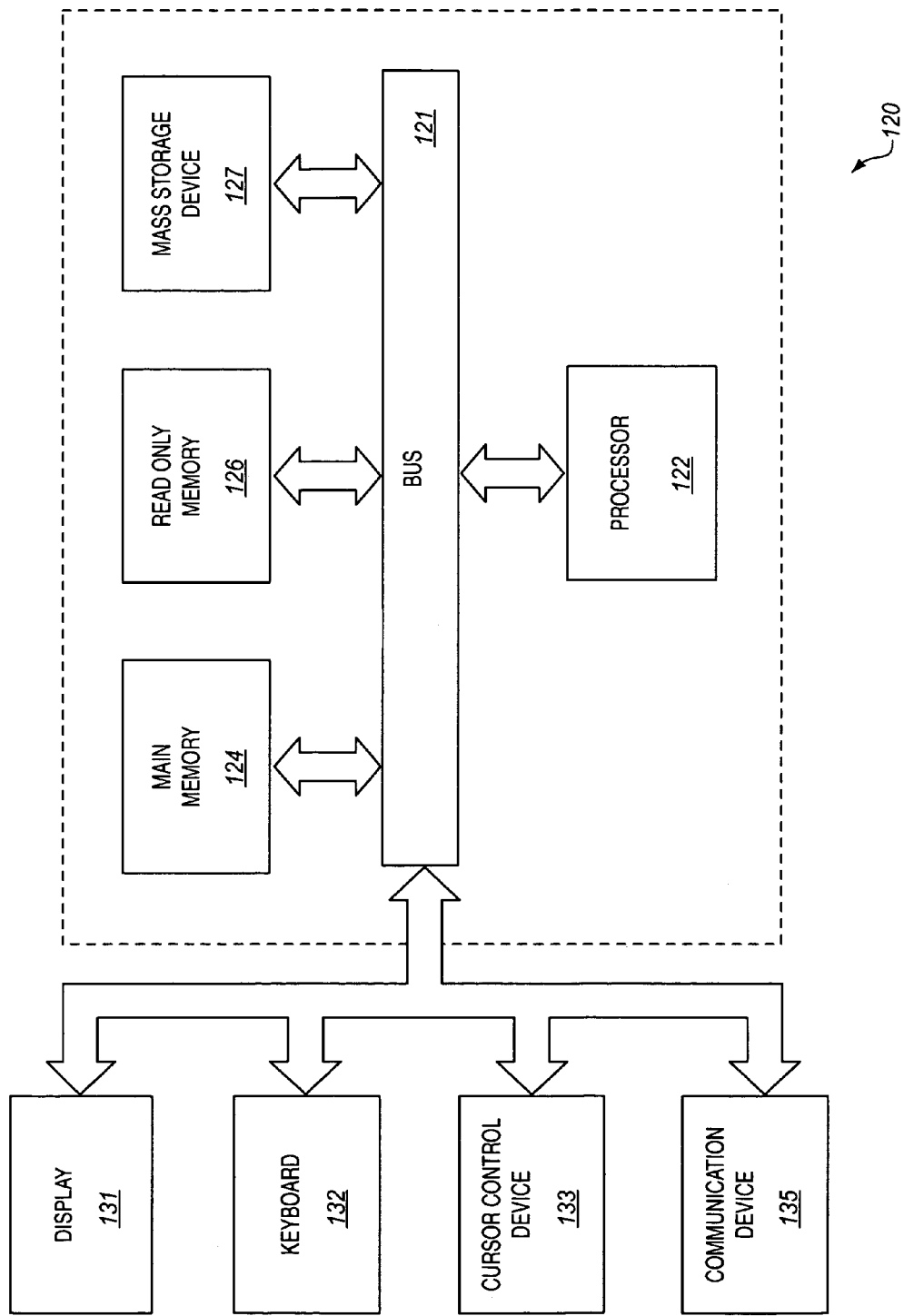
FIG. 8 is an example of a computer system capable of incorporating aspects of the present invention.

FIG. 8 shows a computer system 120 representing an example of a system upon which microelectronic devices, packages, and printed circuit boards incorporating aspects of the present invention may be used. The computer system 120 includes a bus or other communication means 121 for communicating information, and a processing means such as a microprocessor 122 coupled with the bus 121 for processing information. The computer system 120 further includes a main memory 124, such as a random access memory (RAM) or other dynamic data storage device, coupled to the bus 121 for storing information and instructions to be executed by the processor 122. The main memory also may be used for storing temporary variables or other intermediate information during execution of instructions by the processor.

The computer system may also include a nonvolatile memory 126, such as a read only memory (ROM) or other static data storage device coupled to the bus for storing static information and instructions for the processor. A mass memory 127 such as a magnetic disk or optical disc and its corresponding drive may also be coupled to the bus of the computer system for storing information and instructions.

The computer system may also be coupled via the bus to a display device or monitor 131, such as a Liquid Crystal Display (LCD), for displaying information to a user. For example, graphical and textual indications of installation status, operations status and other information may be presented to the user on the display device. Typically, an alphanumeric input device 132, such as a keyboard with alphanumeric, function and other keys, may be coupled to the bus for communicating information and command selections to the processor. A cursor control input device 133, such as a mouse, a trackball, or cursor direction keys may be coupled to the bus for communicating direction information and command selections to the processor and to control cursor movement on the display 131.

A communication device 135 is also coupled to the bus 121. The communication device 135 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

Any or more of the components of FIG. 8 may be implemented using one or more dies, die stacks or other types of microelectronic devices that include wiring applied as described above. In addition, the components may be mounted on a printed circuit board that contains circuit lines formed by ink jet printing or depositing as described above. A lesser or more equipped computer system than the example described above may be preferred for certain implementations. Therefore, the configuration of the exemplary computer system 120 will vary from implementation to implementation depending upon numerous factors, such as price constraints, performance requirements, technological improvements, or other circumstances.

It is to be appreciated that a lesser or more complex paste, printing process, deposition process, or shaping and forming process may be used than those shown and described herein. Therefore, the compositions and processes may vary from implementation to implementation depending upon numerous factors, such as price constraints, performance requirements, technological improvements, or other circumstances. Embodiments of the invention may also be applied to other types of surfaces of microelectronic devices and related components than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
    applying a catalyst to a plurality of different points on a substrate;
    growing carbon nanotubes vertically on the plurality of different points to form a plurality of vertical carbon nanotube structures on the substrate; and
    rolling the vertical carbon nanotube structures to form horizontal carbon nanotube structures.

2. The method of claim 1, wherein growing carbon nanotubes comprises applying at least one of chemical vapor deposition (CVD), plasma enhanced chemical vapor deposition (PECVD), physical vapor deposition (PVD), laser ablation, and arc discharge to the catalyst and substrate.

3. The method of claim 1, wherein applying the catalyst comprises applying a plurality of metal bumps to the substrate.

4. The method of claim 1, wherein rolling the carbon nanotube structures comprises forming interconnect structures on the substrate to couple electronic components.

5. The method of claim 4, further comprising applying a nano-particle paste containing carbon nanotubes to the horizontal structures to electrically couple horizontal structures.

6. The method of claim 5, wherein applying a nano-particle paste comprises printing the paste.

7. The method of claim 5 wherein applying the nano-particle paste comprises ink-jet printing, the paste comprising:
- a dispersant;
- a stabilizer; and
- carbon nanotubes.

8. The method of claim 7, wherein the carbon nanotubes of the paste comprise black powder carbon nanotubes.

9. The method of claim 7, wherein the paste further comprises metal nano-particles.

10. The method of claim 9, wherein the metal comprises copper.

11. The method of claim 5, further comprising curing the paste by sintering after applying.

12. The method of claim 11, further comprising applying a layer of additional metal paste over the cured metal paste.

13. The method of claim 1, further comprising growing additional carbon nanotubes vertically on the horizontal carbon nanotube structures.

14. The method of claim 1, further comprising applying the catalyst with a size selected based on the desired size of the vertical carbon nanotube structure.

\* \* \* \* \*